United States Patent
Nanataki et al.

(10) Patent No.: US 7,183,694 B2
(45) Date of Patent: Feb. 27, 2007

(54) PIEZOELECTRIC/ELECTROSTRICTIVE DEVICE

(75) Inventors: Tsutomu Nanataki, Toyoake (JP);
Kunihiko Yoshioka, Nagoya (JP);
Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/282,013

(22) Filed: Nov. 17, 2005

(65) Prior Publication Data

US 2006/0108897 A1 May 25, 2006

(30) Foreign Application Priority Data

Nov. 19, 2004 (JP) .............. 2004-335750

(51) Int. Cl.
*B41J 2/045* (2006.01)
(52) U.S. Cl. .................... 310/324; 347/71; 347/72
(58) Field of Classification Search ................ 310/324; 367/157, 163; 347/68–72
See application file for complete search history.

(56) References Cited

U.S. PATENT DOCUMENTS

| | | | | |
|---|---|---|---|---|
| 5,545,461 A | | 8/1996 | Takeuchi et al. | 428/138 |
| 5,774,961 A | * | 7/1998 | Takeuchi et al. | 29/25.35 |
| 5,852,337 A | * | 12/1998 | Takeuchi et al. | 310/324 |
| 5,889,351 A | | 3/1999 | Okumura et al. | 310/321 |
| 5,997,671 A | * | 12/1999 | Takeuchi et al. | 310/324 |
| 6,108,880 A | * | 8/2000 | Takeuchi et al. | 29/25.35 |
| 6,348,115 B1 | | 2/2002 | Takeuchi et al. | 156/89.11 |
| 6,407,481 B1 | * | 6/2002 | Takeuchi et al. | 310/324 |
| 6,541,895 B2 | | 4/2003 | Yamaguchi | 310/324 |

FOREIGN PATENT DOCUMENTS

| | | |
|---|---|---|
| JP | H08-201265 | 8/1996 |
| JP | 2000351213 A * | 12/2000 |
| JP | 2002-261347 | 9/2002 |

OTHER PUBLICATIONS

U.S. Appl. No. 11/089,113, filed Mar. 24, 2005, Yamaguchi et al.
U.S. Appl. No. 11/281,645, filed Nov. 17, 2005, Nanataki et al.

* cited by examiner

*Primary Examiner*—Darren Schuberg
*Assistant Examiner*—J. Aguirrechea
(74) *Attorney, Agent, or Firm*—Burr & Brown

(57) ABSTRACT

A piezoelectric/electrostrictive device includes: a ceramic substrate having a frame-like thick portion, a thin diaphragm portion, and a cavity formed by the thick portion and the thin diaphragm portion to communicate with the outside; and a piezoelectric/electrostrictive element having a layered structure including a lower electrode, a piezoelectric/electrostrictive film, and an upper electrode. Furthermore, the thin diaphragm portion is provided with an outward protruding arch shape, and in the piezoelectric/electrostrictive element, there remains a tensile stress parallel to a fixed surface of the element to the thin diaphragm portion. The piezoelectric/electrostrictive device is superior in response, and in the device high-precision (high-resolution, high-sensitivity) detection is possible, while effectively preventing decay of vibration of a thin diaphragm portion and maintaining displacement (amplitude) to be high.

4 Claims, 1 Drawing Sheet

PIEZOELECTRIC/ELECTROSTRICTIVE DEVICE

BACKGROUND OF THE INVENTION

1. Field of the Invention

The present invention relates to a piezoelectric/electrostrictive device, more particularly to a piezoelectric/electrostrictive device for use as an actuator utilizing a flexural displacement, or various types of sensors (e.g., a sensor for a microphone, a viscosity sensor, etc.) for detecting fluid properties, sound pressure, micro weight, acceleration or the like.

2. Description of the Related Art

A piezoelectric/electrostrictive device is used as an actuator or various types of sensors. As such piezoelectric/electrostrictive device, there is disclosed, for example, a device for use in measuring fluid properties such as density, concentration, and viscosity (see Japanese Patent Application Laid-Open No. 8-201265). Such piezoelectric/electrostrictive device is used as a sensor by utilizing correlation between amplitude of the piezoelectric/electrostrictive device as a vibrator and viscous resistance of the fluid brought into contact with the piezoelectric/electrostrictive device (vibrator).

In general, it is possible to replace a vibration configuration such as the vibration of the vibrator in a mechanical system with an equivalent circuit in an electrical system. When the piezoelectric/electrostrictive device (vibrator) is vibrated in a fluid, this vibrator receives a mechanical resistance based on the viscous resistance of the fluid, and accordingly an electric constant of the equivalent circuit of a piezoelectric/electrostrictive element constituting the vibrator changes. By utilizing this, fluid properties such as the viscosity, the density, and the concentration are measured. Here, examples of a measurable fluid include a liquid and a gas. Such liquid may comprise a single component such as water, alcohol, or oil. Examples of the liquid include a liquid obtained by dissolving, mixing, or suspending a soluble or insoluble medium in the component, a slurry, and a paste.

Moreover, examples of the electric constant include dielectric loss factor, phase, resistance, reactance, conductance, susceptance, inductance, and capacitance. The dielectric loss factor or the phase is especially preferably used which has one maximum or minimum change point in the vicinity of a resonance frequency of the equivalent circuit. Accordingly, it is possible to measure not only the viscosity of the fluid but also the density or the concentration thereof (e.g., sulfuric acid concentration in an aqueous sulfuric acid solution). It is to be noted that in addition to the electric constant, a change of the resonance frequency may be utilized as an index for detecting the change of the vibration configuration as long as there is not any special problem from viewpoints of measurement precision and durability.

As such piezoelectric/electrostrictive device, there is disclosed a device comprising: a ceramic substrate having a thick portion, and a thin diaphragm portion which is formed integrally with the thick portion to form a cavity; and a piezoelectric/electrostrictive element fixed to an outer surface of the substrate. An auxiliary electrode is formed in a position independent of a lower electrode constituting the piezoelectric/electrostrictive element in such a manner that a part of the auxiliary electrode is disposed under a part of a piezoelectric/electrostrictive film (see Japanese Patent Application Laid-Open No. 2002-261347). According to such constitution, an upper electrode can be formed on the surfaces of the auxiliary electrode and the piezoelectric/electrostrictive element continuously without breaking of wire, and reliability of connection of the upper electrode can be enhanced. It is to be noted that a fluid to be measured is introduced into the cavity via a through hole to fill in the cavity. Furthermore, when the auxiliary electrode is continuously formed on not only the outer surface of the thin diaphragm portion but also the thick portion, it is possible to obtain the piezoelectric/electrostrictive device which has stabilized device properties and which is not easily limited by use conditions.

In the piezoelectric/electrostrictive devices disclosed in the above-described patent documents and the like, although the thin diaphragm portion only is to be vibrated in conjunction with driving of the piezoelectric/electrostrictive element, in actual, not only the thin diaphragm portion but also the thick portion are vibrated, vibration energy of the thin diaphragm portion decays, and displacement (amplitude) is decreased. Moreover, since response is lowered, there is a problem that it is difficult to perform high-precision (high-resolution, high-sensitivity) detection.

SUMMARY OF THE INVENTION

The present invention has been developed in view of the above-described problems, and an object is to provide a piezoelectric/electrostrictive device which is superior in response and in which high-precision (high-resolution, high-sensitivity) detection is possible, while effectively preventing decay of vibration of a thin diaphragm portion and maintaining displacement (amplitude) to be high.

To achieve the object, according to the present invention, there is provided the following piezoelectric/electrostrictive device.

[1] A piezoelectric/electrostrictive device comprising a ceramic substrate having a frame-like thick portion, a thin diaphragm portion disposed integrally on an end surface of the thick portion in such a manner as to cover the thick portion, and a cavity formed by the thick portion and the thin diaphragm portion in such a manner as to communicate with the outside; and a piezoelectric/electrostrictive element having a layered structure fixed to an outer surface of the thin diaphragm portion of the ceramic substrate and including a lower electrode, a piezoelectric/electrostrictive film, and an upper electrode, the thin diaphragm portion of the ceramic substrate being vibrated in conjunction with driving of the piezoelectric/electrostrictive element, while changing an internal volume of the cavity, wherein the thin diaphragm portion has an outward protruding arch shape, and in the piezoelectric/electrostrictive element, there remains a tensile stress parallel to a fixed surface of the piezoelectric/electrostrictive element with respect to the thin diaphragm portion.

[2] The piezoelectric/electrostrictive device according to the above paragraph [1], wherein the piezoelectric/electrostrictive element is formed by a film forming technology, and obtained by disposing a constituting material having a thermal expansion coefficient larger than that of the constituting material of the thin diaphragm portion on the outer surface of the thin diaphragm portion, and thermally treating the constituting material to fix the constituting material onto the outer surface of the thin diaphragm portion.

According to the present invention, there is provided the piezoelectric/electrostrictive device which effectively prevents the decay of the vibration of the thin diaphragm portion and which is superior in response while maintaining the displacement (amplitude) to be high and in which the high-precision (high-resolution, high-sensitivity) detection is possible.

DESCRIPTION OF THE PREFERRED EMBODIMENT

An embodiment of a piezoelectric/electrostrictive device of the present invention will be described hereinafter with reference to the drawings.

Figure 1:
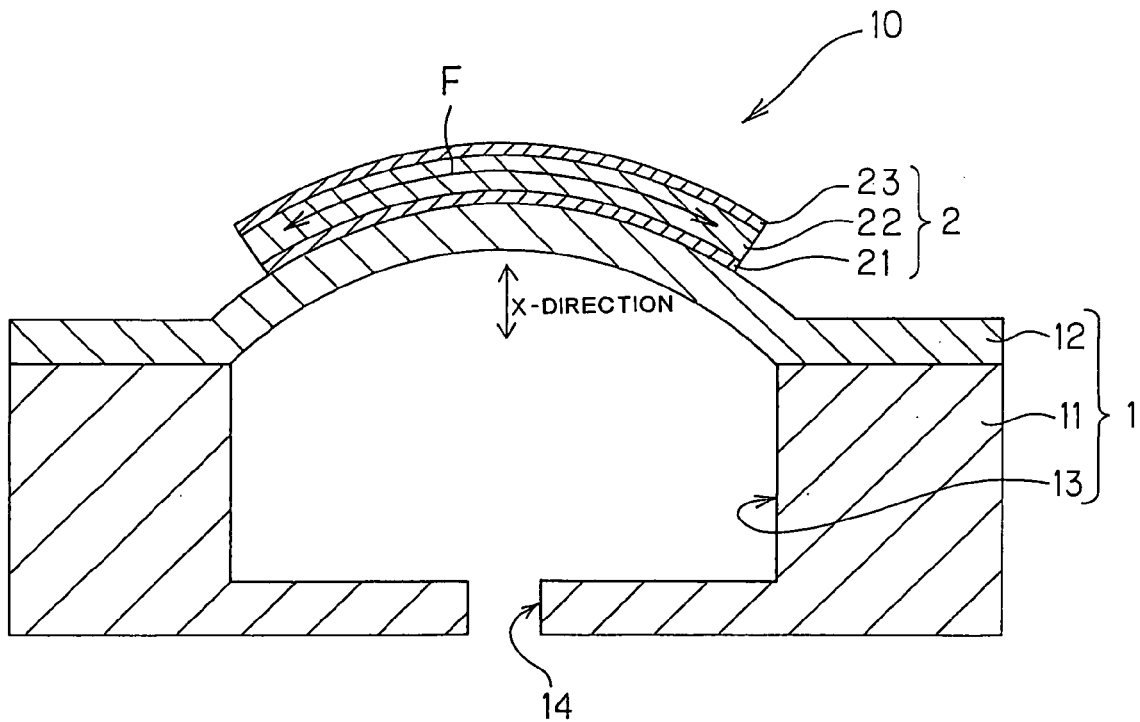
FIG. 1 is an explanatory view schematically showing one embodiment of a piezoelectric/electrostrictive device of the present invention.
Figure 2:
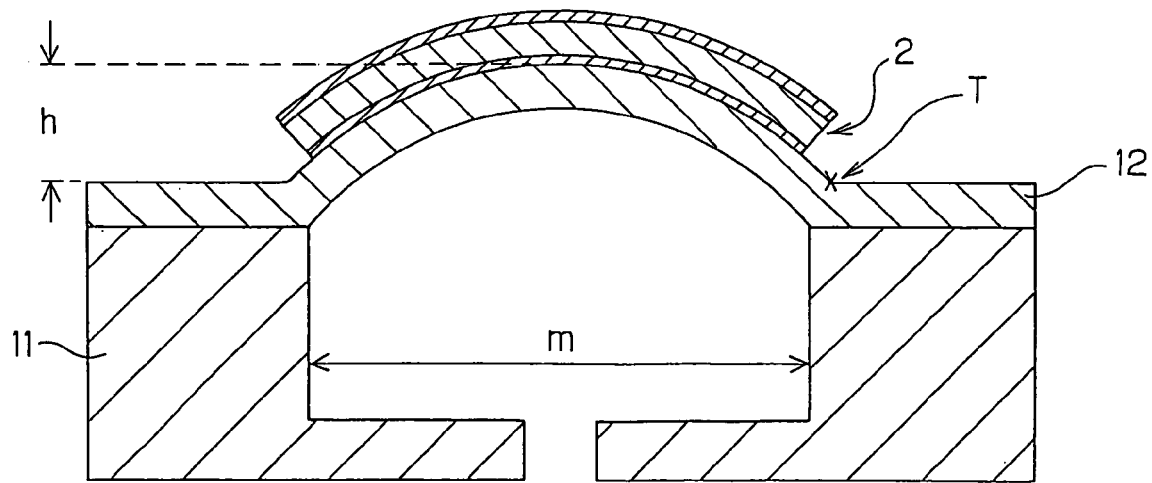
FIG. 2 is an explanatory view schematically showing a protrusion amount of an outward protruding arch shape of a thin diaphragm portion.

FIG. 1 is an explanatory view schematically showing one embodiment of the piezoelectric/electrostrictive device of the present invention, and FIG. 2 is an explanatory view schematically showing a protrusion amount of an outward protruding arch shape of a thin diaphragm portion.

As shown in FIG. 1, according to the present embodiment, the piezoelectric/electrostrictive device comprises: a ceramic substrate 1 having a frame-like thick portion 11, a thin diaphragm portion 12 disposed integrally on an end surface of the thick portion 11 in such a manner as to cover the thick portion 11, and a cavity 13 formed by the thick portion 11 and the thin diaphragm portion 12 in such a manner as to communicate with the outside; and a piezoelectric/electrostrictive element 2 having a layered structure fixed to an outer surface of the thin diaphragm portion 12 of the ceramic substrate 1 and including a lower electrode 21, a piezoelectric/electrostrictive film 22, and an upper electrode 23. The thin diaphragm portion 12 of the ceramic substrate 1 can vibrate in conjunction with driving of the piezoelectric/electrostrictive element 2, while changing an internal volume of the cavity 13 in a piezoelectric/electrostrictive device 10. The thin diaphragm portion 12 has an outward protruding arch shape, and in the piezoelectric/electrostrictive element 2, there remains a tensile stress F parallel to a fixed surface of the piezoelectric/electrostrictive element 2 with respect to the thin diaphragm portion 12. A magnitude of the tensile stress F is preferably 50 MPa to 200 MPa. When the tensile stress F is less than 50 MPa, displacement is reduced, and vibration energy is sometimes remarkably scattered. When the stress exceeds 200 MPa, a breaking strength comes close to that of a piezoelectric/electrostrictive film, and an element having a high reliability cannot be obtained in some case.

In the present embodiment, the thin diaphragm portion 12 is constituted to have the outward protruding arch shape. According to this constitution, strain or stress generated in the piezoelectric/electrostrictive element 2 can be efficiently converted into the displacement. That is, when driving the piezoelectric/electrostrictive element 2 formed on the outer surface of the thin diaphragm portion 12 having the outward protruding arch shape, the element is displaced in a direction (X-direction) vertical to the outer surface of the thin diaphragm portion 12. Therefore, in conjunction with the driving of the piezoelectric/electrostrictive element 2, the thin diaphragm portion 12 of the ceramic substrate 1 also vibrates in the direction (X-direction) vertical to the outer surface, while changing the internal volume of the cavity 13. Since the piezoelectric/electrostrictive element 2 (specifically, at least the lower electrode 21 and the piezoelectric/electrostrictive film 22) is formed on the outer surface of the thin diaphragm portion 12 having the outward protruding arch shape, it is possible to enhance effectively rigidity of a portion of the thin diaphragm portion 12 in which the piezoelectric/electrostrictive element 2 is formed. Since the thin diaphragm portion 12 has the outward protruding arch shape, it is possible to enhance a mechanical strength with respect to a pressing force from an outer surface of the thin diaphragm portion 12. Furthermore, it is also possible to increase a natural frequency and a response speed of the thin diaphragm portion 12 on which the piezoelectric/electrostrictive element 2 is formed.

As shown in FIG. 2, the protrusion amount of the outward protruding arch shape of the thin diaphragm portion 12 of the ceramic substrate 1 is determined appropriately in order to achieve the object of the present invention. A protrusion ratio $[(y)=(h/m) \times 100]$ is represented by a percentage of a protrusion amount (maximum protrusion amount) (h) in the vicinity of a central portion of the thin diaphragm portion 12 with respect to a length (shortest dimension passing through a center of the cavity 13 in the ceramic substrate 1) (m) of the cavity 13 in the piezoelectric/electrostrictive element 2 in a short direction. In general, in order to secure an effective displacement, the ratio is preferably 0.1 to 10%. The ratio is more preferably 0.5 to 5% in order to obtain a large displacement.

Here, the length (m) of the cavity 13 in the ceramic substrate 1 in the short direction and the protrusion amount (maximum protrusion amount) (h) in the vicinity of the central portion of the thin diaphragm portion 12 can be obtained from length measurement by SEM observation of a section or a factory microscope. It is to be noted that the length (m) of the cavity 13 in the short direction means: for example, a diameter of a circle in a case where a shape (sectional shape vertical to the X-direction) of the cavity 13 is the circle; a length of a short side of a rectangle in a case where the shape is rectangle; or a length corresponding to that of a short axis of an ellipse in a case where the shape is the ellipse.

As described above, in the present embodiment, the piezoelectric/electrostrictive element 2 is constituted in which there remains the tensile stress F parallel to the fixed surface of the element to the thin diaphragm portion 12. This constitution effectively prevents the vibration energy due to the driving of the piezoelectric/electrostrictive element 2 from being diffused in the thick portion 11, and prevents the vibration of the thin diaphragm portion from being decayed. It is therefore possible to maintain displacement (amplitude) to be high.

As described above, in the piezoelectric/electrostrictive device of the present embodiment, the decay of the vibration of the thin diaphragm portion is effectively prevented, and the displacement (amplitude) is maintained to be high. Moreover, the device is superior in response, and high-precision (high-resolution, high-sensitivity) detection is possible.

In the present embodiment, the piezoelectric/electrostrictive element 2 is preferably formed by a film forming technology, and obtained by disposing a constituting material having a coefficient of thermal expansion larger than that of the constituting material of the thin diaphragm portion 12 on the outer surface of the thin diaphragm portion 12, and thermally treating the constituting material to fix the material onto the outer surface of the thin diaphragm portion 12. When the material is fixed by the thermal treatment, a stress can be generated by a difference of the thermal expansion coefficient in a temperature lowering process of the thermal treatment. According to the above-described constitution, an appropriate tensile stress can remain in the piezoelectric/electrostrictive element 2. After description of each constituting element, there will be described a typical combination or the like of the constituting materials of the thin diaphragm portion 12 and the piezoelectric/electrostrictive element 2, which satisfies such conditions of the thermal expansion coefficient.

According to this constitution, inside the piezoelectric/electrostrictive element 2, a structure obtained from the remaining tensile stress F parallel to the fixed surface of the element to the thin diaphragm portion 12 can be easily and efficiently formed. There can be easily and efficiently obtained the piezoelectric/electrostrictive device capable of performing the high-precision (high-resolution, high-sensitivity) detection.

Each constituting element for use in the piezoelectric/electrostrictive device of the present invention will be described hereinafter specifically.

A material of the ceramic substrate 1 for use in the present invention preferably has heat resistance, chemical stability, and insulating property. This is because the above-described thermal treatment is sometimes performed in fixing to the outer surface the piezoelectric/electrostrictive element 2 (including the lower electrode 21, the piezoelectric/electrostrictive film 22, and the upper electrode 23) described later. In a case where the piezoelectric/electrostrictive device is used as a sensor element for detecting properties of a liquid, the liquid sometimes has conductivity or corrosive property.

From such viewpoint, examples of a ceramic preferably for use as the constituting material of the ceramic substrate 1 include stabilized zirconium oxide, aluminum oxide, magnesium oxide, mullite, aluminum nitride, silicon nitride, and glass. Above all, stabilized zirconium oxide is more preferable because it can retain a high mechanical strength and is superior in tenacity even in a case where the thin diaphragm portion 12 is constituted to be thin. It is to be noted that such ceramic has a thermal expansion coefficient of $3 \times 10^{-6}$ to $14 \times 10^{-6}$/K, and the thermal expansion coefficient is especially preferably smaller than that of the piezoelectric/electrostrictive element 2 described later.

A thickness of the thin diaphragm portion 12 of the ceramic substrate 1 is usually 50 μm or less, preferably 30 μm or less, more preferably 15 μm or less lest it should restrict the driving of the piezoelectric/electrostrictive element 2.

Moreover, an outer shape of the thin diaphragm portion 12 may be any one of rectangle, square, triangle, ellipse, and perfect circle as long as the shape is adapted to a frame member shape of the thick portion 11. The rectangular, elongated circular, or elliptic shape is preferable in a case where the cavity 13 is formed by the thick portion 11 and the thin diaphragm portion 12, and a through hole 14 is formed in order to supply or discharge a fluid to be measured with respect to the cavity 13 via the through hole 14 as shown in FIG. 1. The rectangular, elongated circular, or elliptic shape having an aspect ratio of 1.5 or more is more preferable in order to obtain an ideal vibration (displacement).

The piezoelectric/electrostrictive element 2 (including the lower electrode 21, the piezoelectric/electrostrictive film 22, and the upper electrode 23) for use in the present invention is fixed to the outer surface of the thin diaphragm portion 12. The lower electrode 21 constituting the piezoelectric/electrostrictive element 2 is formed into a size equal to a size into which the piezoelectric/electrostrictive film 22 is to be formed on the outer surface of the thin diaphragm portion 12. In this case, a width of the lower electrode 21 in the short direction may be set to be larger than that of the thin diaphragm portion 12, and smaller than that of the piezoelectric/electrostrictive film 22.

An auxiliary electrode (not shown) may be disposed in order to enhance reliability of electric connection of the upper electrode. The auxiliary electrode may be formed continuously in a predetermined position on the outer surface of the thin diaphragm portion 12. The lower electrode 21 and the auxiliary electrode may be constituted of different materials or the same material, and the materials are preferably conductive materials having good bondability with respect to both of the ceramic substrate 1 and the piezoelectric/electrostrictive film 22. Typical examples of the electrode material include a material containing as a main component platinum, palladium, rhodium, silver, or an alloy of them. Especially in a case where the thermal treatment for sintering the material is performed in forming the piezoelectric/electrostrictive film 22, the electrode material is more preferable which contains platinum or an alloy of platinum as the main component. Various types of known film forming technologies can be used in forming the lower electrode 21 and the auxiliary electrode. Examples of such film forming technology include: thin film forming technologies such as ion beam, sputtering, vacuum evaporation, CVD, ion plating, and plating; and thick film forming technologies such as screen printing, spraying, and dipping. Above all, a sputtering process and a screen printing process are preferable.

A bonding layer (not shown) may be disposed between the lower electrode 21 and the auxiliary electrode to connect the piezoelectric/electrostrictive film 22 to the thin diaphragm portion 12. In this case, the bonding layer is formed prior to formation of the piezoelectric/electrostrictive film 22. When such bonding layer is formed, the rigidity of the piezoelectric/electrostrictive element 2 becomes uniform on the outer surface of the thin diaphragm portion 12, and this is preferable for obtaining an ideal vibration (displacement). A material of the bonding layer may be either of organic and inorganic materials as long as an adhering or bondability is high with respect to both of the piezoelectric/electrostrictive film 22 and the ceramic substrate 1. The thermal expansion coefficient of the material constituting the bonding layer preferably has an intermediate value between the thermal expansion coefficients of the constituting materials of the ceramic substrate 1 and the piezoelectric/electrostrictive film 22, so that the bonding having high reliability is obtained. In a case where the piezoelectric/electrostrictive film 22 is thermally treated to be sintered, a preferable material is a material obtained by adding a micro amount of glass component to the constituting material of the piezoelectric/electrostrictive film 22, or a glass material having a softening point which is not less than a thermal treatment temperature of the piezoelectric/electrostrictive film 22. Because the material has a high adhering or bondability with respect to both of the piezoelectric/electrostrictive film 22 and the ceramic substrate 1.

Moreover, the constituting material of the piezoelectric/electrostrictive film 22 described later is $(Bi_{0.5}Na_{0.5})TiO_3$ or a material containing this as the main component, or $(1-x)(Bi_{0.5}Na_{0.5})TiO_3-xKNbO_3$ (x is a molar fraction in a range of $0 \leq x \leq 0.06$) or a material containing this as the main component. In this case, the preferable material of the bonding layer is a material obtained by adding a micro amount of the glass component to a material containing as the main component $(1-x)(Bi_{0.5}Na_{0.5})TiO_3-xKNbO_3$ (x is the molar fraction in a range of $0 \leq x \leq 0.5$). Because the material has the high adhering property with respect to both of the piezoelectric/electrostrictive film 22 and the ceramic substrate 1, and can suppress an adverse influence on the piezoelectric/electrostrictive film 22 and the ceramic substrate 1 during the thermal treatment. That is, when the bonding layer is formed of (1-x) $(Bi_{0.5}Na_{0.5})TiO_3$-$xKNbO_3$ (x is the molar fraction in a range of $0 \leq x \leq 0.5$) to which a micro amount of glass component is added, the layer has a component similar to that of the piezoelectric/electrostrictive film 22. Therefore, the layer obtains the high adhering property to the piezoelectric/electrostrictive film 22. This eliminates a problem which is easily caused owing to diffusion of different types of elements in a case where glass is used alone. When the main component of the bonding layer is (1-x) $(Bi_{0.5}Na_{0.5})TiO_3$-$xKNbO_3$ (x is the molar fraction in a range of $0.08 \leq x \leq 0.5$), a piezoelectric property is hardly shown. Therefore, any vibration (displacement), stress or the like is not generated with respect to an electric field generated in the lower electrode 21 and the auxiliary electrode during use, and stable device properties can be obtained.

A usual thick film forming technology is used in forming the bonding layer. Especially, a stamping process or the screen printing process is used. In a case where a size of a portion to be formed is about several tens to several hundreds of μm, an ink jet process is preferably used. When the thermal treatment of the bonding layer is required, the layer may be thermally treated prior to or simultaneously with the formation of the piezoelectric/electrostrictive film 22.

The piezoelectric/electrostrictive film 22 constituting the piezoelectric/electrostrictive element 2 is formed in such a manner as to be laid on the outer surface of the lower electrode 21 (the auxiliary electrode and the bonding layer if necessary). There is not any special restriction on the constituting material of the piezoelectric/electrostrictive film 22 as long as the material exhibits a piezoelectric/electrostrictive effect. Examples of the material include: lead-based ceramic piezoelectric/electrostrictive materials such as lead zirconate, lead titanate, and lead zirconate titanate (PZT); barium titanate and a barium titanate based ferroelectric ceramics containing barium titanate as the main component; a piezoelectric polymer represented by polyvinylidene fluoride (PVDF); a Bi-based piezoelectric ceramic represented by $(Bi_{0.5}Na_{0.5})TiO_3$; and a Bi layered ceramic. A mixture of these materials, a solid solution, a material obtained by adding an additive to any one of the materials and the like having improved piezoelectric/electrostrictive properties may be used.

The PZT-based ceramic piezoelectric/electrostrictive material is preferably used as a material of a sensor having a high piezoelectric property and capable of performing the high-sensitive detection. Above all, the piezoelectric/electrostrictive film is constituted of a material containing as the main component at least one selected from the group consisting of lead titanate, lead zirconate, magnesium lead niobate, and nickel lead niobate. This is preferable because reactivity to the constituting material of the ceramic substrate 1 is low, the component being thermally treated hardly segregates, a treatment for retaining the composition is smoothly performed, and targeted composition and crystal structure are easily obtained.

In a case where platinum or an alloy containing platinum as the main component is used as the constituting materials of the lower electrode 21 and the auxiliary electrode, $(Bi_{0.5}Na_{0.5})TiO_3$ or a material containing this as the main component is preferably used, because the bondability to these electrodes is higher, fluctuations of the properties of the piezoelectric/electrostrictive device are reduced, and high reliability is obtained. Above all, (1-x) $(Bi_{0.5}Na_{0.5})TiO_3$-$xKNbO_3$ (x is the molar fraction in a range of $0 \leq x \leq 0.06$) or a material containing this as the main component is preferable because the material has a comparatively high piezoelectric property. Various types of known film forming technologies are usable in forming the piezoelectric/electrostrictive film 22 in the same manner as in the lower electrode 21 and the auxiliary electrode. Above all, the screen printing is preferable from a viewpoint of cost reduction.

The piezoelectric/electrostrictive film 22 formed by the above-described method is thermally treated if necessary, and integrated with the lower electrode 21 (the auxiliary electrode and the bonding layer if necessary). In a case where the bondability of the piezoelectric/electrostrictive film 22 to the lower electrode 21 (the auxiliary electrode and the bonding layer if necessary) needs to be strengthened more in order to suppress the fluctuations of the properties of the piezoelectric/electrostrictive device and enhance the reliability, $(Bi_{0.5}Na_{0.5})TiO_3$ or a material containing this as the main component is used. Above all, (1-x) $(Bi_{0.5}Na_{0.5})TiO_3$-$xKNbO_3$ (x is the molar fraction in a range of $0 \leq x \leq 0.06$) or the material containing this as the main component is used, and preferably thermally treated at a temperature of 900 to 1400° C., preferably 1000 to 1300° C. This also applies to a case where the PZT-based ceramic piezoelectric/electrostrictive material is used. In this case, the thermal treatment is preferably performed while controlling an atmosphere together with an evaporation source of the ceramic piezoelectric/electrostrictive material lest the piezoelectric/electrostrictive film 22 should be unstable at the high temperature.

The upper electrode 23 constituting the piezoelectric/electrostrictive element 2 is formed in such a manner as to be laid on the outer surface of the piezoelectric/electrostrictive film 22 formed as described above. As the material of the upper electrode 23, a conductive material is used which has a high bondability to the piezoelectric/electrostrictive film 22, and the upper electrode is formed by a film forming process similar to that of the lower electrode 21 or the auxiliary electrode. Furthermore, the upper electrode 23 is thermally treated if necessary after film formation, and bonded to the piezoelectric/electrostrictive film 22 and the auxiliary electrode to constitute an integral structure. Such thermal treatment is not necessarily required in the same manner as in the lower electrode 21. To realize ideal driving (displacement), the rigidity of the upper electrode is preferably uniform on the thin diaphragm portion 12. For this, it is more preferable to integrate the lower electrode 21, the piezoelectric/electrostrictive film 22, and the upper electrode 23 with the thin diaphragm portion 12 by the thermal treatment than to bond them by use of an adhesive. To obtain a sharp peak, a shape of the upper electrode 23 in a width direction is preferably linearly symmetric. When the electrode is formed to be symmetric, a natural frequency only can be emphasized in vibrating the thin diaphragm portion. Furthermore, a center of the upper electrode 23 is preferably matched with that of the thin diaphragm portion 12. A deviation from the center in a length direction of the thin diaphragm portion 12 is preferably 5% or less with respect to a length of the thin diaphragm portion 12. The deviation in the width direction is preferably 10% or less with respect to the width of the thin diaphragm portion 12. It is to be noted that a ratio of an area effective for driving the upper electrode 23 to an area of the thin diaphragm portion 12 is preferably 15 to 40%. In this range, a necessary vibration can be obtained for the detecting, and the rigidity advantageous for the vibrating can be obtained.

It is to be noted that when the lower electrode 21, the bonding layer if necessary, the piezoelectric/electrostrictive film 22, and the upper electrode 23 are bonded by the thermal treatment, the thermal treatment may be performed every time each of them is formed, or they may be simultaneously thermally treated after the respective films are formed successively. During the thermal treatment, an appropriate thermal treatment temperature is preferably selected in order to obtain the satisfactory bondability or suppress changes of the properties due to diffusion of the constituting element. FIG. 1 shows a case where the through hole 14 is formed in the cavity 13, but there is not any special restriction, and the structure of the cavity 13 or the like where the piezoelectric/electrostrictive device comes into contact with the fluid may be a simple cavity structure. Furthermore, an end portion of the piezoelectric/electrostrictive film 22 in the length direction may be set to have a length that does not exceed that of the thin diaphragm portion 12, and the piezoelectric/electrostrictive film 22 may not be extended to the thick portion 11.

As described above, the piezoelectric/electrostrictive element 2 is preferably obtained by disposing the constituting material having a thermal expansion coefficient larger than that of the constituting material of the thin diaphragm portion 12 on the outer surface of the thin diaphragm portion 12, thereafter thermally treating the material, and fixing the material onto the outer surface of the thin diaphragm portion 12. Typically, from the viewpoint of the thermal treatment, there is preferably used a combination of a constituting material of the thin diaphragm portion 12 having a thermal expansion coefficient of $6 \times 10^{-6}$ to $10 \times 10^{-6}$/K, such as alumina or partially stabilized zirconia with a constituting material of the piezoelectric/electrostrictive element 2 having a thermal expansion coefficient of $10 \times 10^{-6}$ to $15 \times 10^{-6}$/K, such as $BaTiO_3$, $(Bi_{0.5}Ti_{0.5})TiO_3$, $KNbO_3$, $(K,Na)NbO_3$, $(K,Na)(Nb,Ta)O_3$, or a material containing any one of them as the main component. According to this constitution, a structure can be easily and efficiently formed in which there remains the tensile stress parallel to the fixed surface of the piezoelectric/electrostrictive element 2 to the thin diaphragm portion 12.

EXAMPLE

The present invention will be described hereinafter in accordance with examples in more detail, but the present invention is not limited to these examples.

Example 1

A ceramic substrate having an integral structure was prepared in which a frame-like thick portion having a rectangular cavity having a size of 6 mm×1.1 mm formed therein was covered by a thin diaphragm portion having a thickness of 10 μm. It is to be noted that the ceramic substrate was prepared by: mixing a ceramic mixed powder made of 80 wt % of a 3 mol % yttria partially stabilized zirconia powder and 20 wt % of an alumina powder and having an average particle diameter of 0.4 μm with a binder, a plasticizer, and an organic solvent by a usual method to prepare a slurry; molding a green sheet for the thick portion by use of the slurry in a doctor blade process in such a manner as to obtain a thickness of 200 μm after sintering; on the other hand, blending the 3 mol % yttria partially stabilized zirconia powder having an average particle diameter of 0.3 μm with the binder, the plasticizer, and the organic solvent by the usual method to prepare a slurry; thereafter molding a green sheet for the thin diaphragm portion in a reverse roll coater device in such a manner as to obtain a thickness of 10 μm after the sintering; pattern-punching (forming the cavity) the green sheet for the thick portion obtained as described above by use of a predetermined mold; thereafter stacking the green sheet for a diaphragm plate prepared as described above on the molded sheet; thermally press-bonding the sheets with a pressure of 100 kg/cm$^2$ on conditions of 80° C.×one minute; and firing the laminated sheets at a temperature of 1500° C. for two hours to thereby obtain the ceramic substrate in which the thin diaphragm portion was formed into an outward protruding arch shape (maximum protrusion amount (h)=30 μm). The ceramic substrate had a thermal expansion coefficient of $9.5 \times 10^{-6}$/K. Moreover, a platinum paste was printed in a predetermined position on an outer surface of the thin diaphragm portion of the ceramic substrate by a screen printing process in such a manner as to obtain a thickness of 5 μm after the firing, and the substrate was dried at 120° C. for ten minutes. Thereafter, the substrate was fired at 1350° C. for two hours to thereby form a lower electrode. Further on the lower electrode, the printing was performed using as a piezoelectric/electrostrictive material a material made of $0.98(Bi_{0.5}Na_{0.5})TiO_3$-$0.02KNbO_3$ (numerals are molar fractions) having a thermal expansion coefficient of $13 \times 10^{-6}$/K by the screen printing process in such a manner as to obtain a thickness of 20 μm after the firing, the drying was then performed at 120° C. for 20 minutes, and thereafter a piezoelectric/electrostrictive film was fired at 1100° C. to form the piezoelectric/electrostrictive film. Thereafter, an upper electrode of Au was formed on the lower electrode and the piezoelectric/electrostrictive film disposed on the thin diaphragm portion having an outward protruding shape on the resultant ceramic substrate by a sputtering process to obtain the piezoelectric/electrostrictive device of the present invention. It is to be noted that a thickness of the upper electrode was set to 0.1 μm. In the resultant piezoelectric/electrostrictive device, a voltage of 150 V was applied between the upper electrode and the lower electrode constituting a piezoelectric/electrostrictive element to perform a polarization treatment.

Example 2

A piezoelectric/electrostrictive device was obtained in the same manner as in Example 1 except that a sintered body of a piezoelectric/electrostrictive material having a thickness of 20 μm and made of $0.98(Bi_{0.5}Na_{0.5})TiO_3$-$0.02KNbO_3$ (numerals being molar fractions) was separately sintered and obtained on a thin diaphragm portion of a ceramic substrate similar to that used in Example 1, and the sintered body was attached using a conductive adhesive while grasping the body with a jig to pull the body by a force corresponding to a tensile stress of 100 MPa.

Comparative Example 1

A piezoelectric/electrostrictive device was obtained in the same manner as in Example 1 except that a sintered body of a piezoelectric/electrostrictive material having a thickness of 20 μm and made of $0.98(Bi_{0.5}Na_{0.5})TiO_3$-$0.02KNbO_3$ (numerals being molar fractions) was separately sintered and obtained on a thin diaphragm portion of a ceramic substrate similar to that used in Example 1, and the sintered body was attached using a conductive adhesive similar to that used in Example 2 (tensile stress was not allowed to remain in a piezoelectric/electrostrictive element).

As to three piezoelectric/electrostrictive devices obtained in Examples 1, 2 and Comparative Example 1, a voltage of 30 V was applied in the same direction as a direction in which a polarization treatment was performed between an upper electrode and a lower electrode constituting a piezoelectric/electrostrictive element in each piezoelectric/electrostrictive device. A displacement of each piezoelectric/electrostrictive element was measured with a laser Doppler device. Moreover, the displacement on a thick portion was measured for a purpose of evaluating a scattered state (decay property) of vibration energy in the thick portion. Results are shown in Table 1.

TABLE 1

|  | Piezoelectric/electrostrictive element displacement (μm) | Displacement (μm) of thick portion |
|---|---|---|
| Example 1 | 0.12 | 0.00 |
| Example 2 | 0.10 | 0.10 |
| Comparative Example 1 | 0.06 | 0.03 |

It is seen from Table 1 that in Examples 1, 2 in which the tensile stress is allowed to remain in the piezoelectric/electrostrictive element, the displacement is higher, and decay of vibration of the thin diaphragm portion is more effectively prevented as compared with Comparative Example 1 in which the tensile stress is not allowed to remain. It is further seen that as to the Examples 1 and 2 allowing the tensile stress to remain in the piezoelectric/electrostrictive element, in Example 1 in which the piezoelectric/electrostrictive material having the thermal expansion coefficient larger than that of the constituting material of the thin diaphragm portion is disposed on the outer surface of the thin diaphragm portion, thereafter thermally treated, and fixed onto the outer surface of the thin diaphragm portion, the tensile stress more effectively remains, the displacement (amplitude) is higher, and the decay of the vibration is more effectively prevented as compared with Example 2 in which the material is fixed without being thermally treated.

A piezoelectric/electrostrictive device of the present invention is effectively used in various types of industrial fields which require a piezoelectric/electrostrictive film type actuator (see "Piezoelectric/Electrostrictive Actuator: from Basic to Application" authored by Kenji Uchino, edited by Japanese Industrial Technical Center, and published Morikita Shuppan) of a uni-morph type or such a type to generate a flexural displacement, for use in an actuator utilizing the flexural displacement; various types of sensors such as a microphone sensor and a viscosity sensor for detecting fluid properties, sound pressure, micro weight, acceleration and the like; a filter; a transformer; a sound generator such as a speaker; a vibrator and an oscillator for power or communication; a display; a servo displacement element; a pulse driving motor; an ultrasonic motor and the like.

What is claimed is:

1. A piezoelectric/electrostrictive device comprising:
a ceramic substrate having a frame-like thick portion, a thin diaphragm portion disposed integrally on an end surface of the thick portion in such a manner as to cover the thick portion, and a cavity formed by the thick portion and the thin diaphragm portion in such a manner as to communicate with the outside; and
a piezoelectric/electrostrictive element having a layered structure fixed to an outer surface of the thin diaphragm portion of the ceramic substrate and including a lower electrode, a piezoelectric/electrostrictive film, and an upper electrode, the thin diaphragm portion of the ceramic substrate being vibrated in conjunction with driving of the piezoelectric/electrostrictive element, while changing an internal volume of the cavity,
wherein the thin diaphragm portion has an outward protruding arch shape that is one of a rectangular shape, an elongated circular shape, and an elliptical shape having an aspect ratio of 1.5 or more, and in the piezoelectric/electrostrictive element, there remains a tensile stress of 50 MPa to 200 MPa parallel to a fixed surface of the piezoelectric/electrostrictive element with respect to the thin diaphragm portion.

2. The piezoelectric/electrostrictive device according to claim 1, wherein the piezoelectric/electrostrictive element is formed by a film forming technology, and obtained by disposing a constituting material having a thermal expansion coefficient larger than that of the constituting material of the thin diaphragm portion on the outer surface of the thin diaphragm portion, and thermally treating the constituting material to fix the constituting material onto the outer surface of the thin diaphragm portion.

3. The piezoelectric/electrostrictive device according to claim 1, wherein a protrusion ratio [(y)=(h/m)×100] represented by a percentage of the maximum protrusion amount (h) of the thin diaphragm portion with respect to the shortest dimension (m) passing through a center of the cavity in the ceramic substrate is 0.1 to 10%.

4. The piezoelectric/electrostrictive device according to claim 1, wherein a thickness of the thin diaphragm portion of the ceramic substrate is 50 μm or less.

* * * * *